United States Patent
Pu et al.

(10) Patent No.: US 6,830,957 B2
(45) Date of Patent: Dec. 14, 2004

(54) METHOD OF FABRICATING BGA PACKAGES

(75) Inventors: Han-Ping Pu, Taipei Hsien (TW); Chien-Ping Huang, Hsinchu Hsien (TW); Chih-Ming Huang, Hsinchu Hsien (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 31 days.

(21) Appl. No.: 10/452,488

(22) Filed: May 30, 2003

(65) Prior Publication Data

US 2004/0058471 A1 Mar. 25, 2004

(30) Foreign Application Priority Data

Sep. 19, 2002 (TW) .......................... 91121439 A

(51) Int. Cl.⁷ .............................. H01L 21/44
(52) U.S. Cl. .................... 438/108; 438/126; 257/787; 257/778
(58) Field of Search ................ 438/106, 108, 438/113, 126; 257/778, 787

(56) References Cited

U.S. PATENT DOCUMENTS

| | | | |
|---|---|---|---|
| 5,200,366 A | 4/1993 | Yamada et al. | |
| 5,918,746 A | 7/1999 | Tokita et al. | |
| 6,038,136 A | 3/2000 | Weber | |
| 6,752,204 B2 | * 6/2004 | Dishongh et al. | 165/185 |
| 2003/0205799 A1 | * 11/2003 | Yunus | 257/684 |

* cited by examiner

*Primary Examiner*—Michael S. Lebentritt
*Assistant Examiner*—Brad Smith
(74) *Attorney, Agent, or Firm*—Mikio Ishimaru

(57) ABSTRACT

A method of fabricating BGA (Ball Grid Array) packages is proposed, which utilizes a specially-designed carrier to serve as an auxiliary tool to package semiconductor chips on substrates. The carrier is formed with a plurality of cavities respective for receiving a substrate and in communication with an injection gate, such that no injection gate is required on the substrate, thereby not restricting the trace routability on the substrate. Moreover, a two-piece type of mold is allowed being used to form a number of encapsulation bodies at one time, making the fabrication more productive and cost-effective. Furthermore, the proposed BGA fabrication method can be implemented without having to provide an air outlet in the substrate but allows the resulted encapsulation body to be free of voids to assure the quality of the packages. The proposed BGA fabrication method is therefore more advantageous to use than the prior art.

13 Claims, 3 Drawing Sheets

METHOD OF FABRICATING BGA PACKAGES

BACKGROUND OF THE INVENTION

1. Field of the Invention

The present invention relates to methods of fabricating Ball Grid Array (BGA) packages, and more particularly, to a method of fabricating Flip-Chip BGA (FCBGA) packages using Build-Up (BU) substrates for carrying semiconductor chips thereon.

2. Description of Related Art

BGA (Ball Grid Array) is an advanced type of integrated circuit packaging technology which is characterized by the use of a substrate whose front side is mounted with a semiconductor chip and whose back side is mounted with a grid array of solder balls. After SMT (Surface Mount Technology) processing, the BGA package can be mechanically bonded and electrically coupled to a printed circuit board (PCB) by means of these solder balls.

FCBGA (Flip-Chip Ball Grid Array) is a more advanced type of BGA technology which is characterized by that the semiconductor chip is mounted in an upside-down manner over the substrate and bonded to the same by means of a plurality of solder bumps attached to the I/O (input/output) pads thereon. This feature allows the semiconductor chip to be electrically connected to the substrate without having to use bonding wires, thereby making the packages more compact in size and providing more I/O connections between the semiconductor chip and the substrate for carrying the same than conventional non-Flip-Chip type BGA packages.

FCBGA packages typically utilize a BU (Build-Up) substrate as chip carrier. However, the yield of BU substrates is generally poor as the fabrication of BU substrates requires complicate processes and technologies. As a result, the BU substrates are commercially available usually in the singulated form instead of a strip type of interconnected conventional BGA substrates, such that an encapsulation body for encapsulating the flip chip requires a molding or encapsulation process to be performed on one single BU substrate at one time. Related prior arts include, for example, U.S. Pat. No. 6,038,136 "CHIP PACKAGE WITH MOLDED UNDERFILL"; U.S. Pat. No. 5,918,746 "CARRIER FRAME USED FOR CIRCUIT BOARDS"; U.S. Pat. No. 5,200,366 "SEMICONDUCTOR DEVICE, ITS FABRICATION METHOD AND MOLDING APPARATUS USED THEREFOR"; to name just a few.

U.S. Pat. No. 6,038,136 teaches a molding process performed for a single BU substrate to form an encapsulation body that encapsulates a flip chip mounted on the substrate. This BU substrate is formed with an injection gate (usually made of gold) thereon through which an encapsulating resin (such as epoxy resin, etc.) can be injected to form the intended encapsulation body. However, since the I/O pads on the flip chip and corresponding conductive traces on the substrate are both arranged in high density, the provision of injection gate on the substrate would adversely affect or undesirably restrict the circuit and trace routability on the substrate.

Moreover, U.S. Pat. No. 6,038,136 further teaches the provision of a hole at the center of the substrate to serve as an air outlet during the molding process to drain air out of the mold, such that no void is left in the resulted encapsulation body and the concern of popcorn effect can be eliminated. However, formation of the hole or air outlet not only increases the fabrication cost of the substrate but further restricts the trace routability on the substrate.

U.S. Pat. No. 5,200,366 discloses the use of a three-piece type of mold for performing the molding process on a single BU substrate. When this mold composed of three pieces is in use during molding, a bottom piece of mold is placed underneath the substrate, while the other two top pieces of mold are mounted on the substrate in a manner that a gap is left between these two pieces and above the substrate to serve as an injection gate where the encapsulation compound can be injected to form the encapsulation body that encapsulates the flip chip on the substrate. However, one significant drawback to this technology is that the three-piece type of mold is rather complex in structure and thus expensively made, thereby undesirably increasing the overall fabrication cost of the FCBGA packages.

In addition, since all of the above-mentioned U.S. patents are primarily used to fabricate one single package unit on each single substrate or to perform the molding process on one single substrate at one time, they are complex and cost-ineffective to implement in practice and also fairly low in productivity of the fabricated packages. Therefore, it is greatly desired to provide a package fabrication method that is cost-effective to perform in a batch manner and allows high yield of fabricated FCBGA packages using the BU substrates.

SUMMARY OF THE INVENTION

It is therefore an objective of the present invention to provide a method of fabricating BGA packages, which can be used fabricate a batch of package units on one single substrate for the purpose of increase the throughput of fabrication.

It is another objective of the present invention to provide a method of fabricating BGA packages, which can be implemented without providing injection gate in the substrate so as not to restrict the circuit and trace routability on the substrate.

It is still another objective of the present invention to provide a method of fabricating BGA packages, which can be implemented without utilizing the costly three-piece type of mold to allow the fabrication more cost-effective to implement.

It is yet another objective of the present invention to provide a method of fabricating BGA packages, which can be implemented without having to provide an air outlet in the substrate but nevertheless allow the resulted encapsulation body to be free of voids to help assure the quality of the finished packages.

In accordance with the above and other objectives, the method of fabricating BGA packages proposed by the present invention comprises the steps of: preparing a batch of BGA substrates, each of the substrates having a front side and a back side, with a singulation line being predefined and at least one semiconductor chip being mounted on the front side of each of the substrates; preparing a carrier, which is formed with a series of cavities in communication with an injection gate; embedding the substrates respectively into the cavities of the carrier; performing an encapsulation process to form an encapsulation body to encapsulate each of the substrates and the corresponding one of the chips which is mounted on the substrate; performing a ball-implantation process to form a ball grid array over the back side of each of the substrates; and performing a singulation process to cut through the singulation lines on the substrates and thereby obtain a plurality of the BGA packages.

The BGA fabrication method according to the invention is characterized by the utilization of a specially-designed carrier to serve as an auxiliary tool to package semiconductor chips on substrates. Compared to prior art, since the invention provides an injection gate in the carrier, it would not restrict the circuit and trace routability on the substrate. Moreover, it allows the use of a two-piece type of mold for batch molding of a number of encapsulation bodies at the same time, allowing the fabrication to be more productive and cost-effective. Still moreover, the invention an be implemented without having to provide an air outlet in the substrate but nevertheless allow the resulted encapsulation body to be free of voids to help assure the quality of the finished packages. The invention is therefore more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the BGA fabrication method according to the invention is disclosed in full details in the following with reference to the accompanying drawings.

Figure 1A:
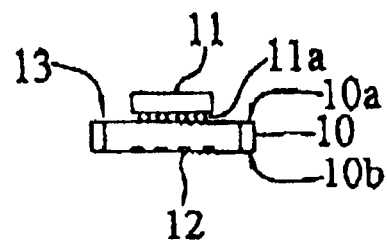
FIG. 1A is a schematic diagram showing a sectional view of a die-mounted BGA substrate.
Figure 1B:
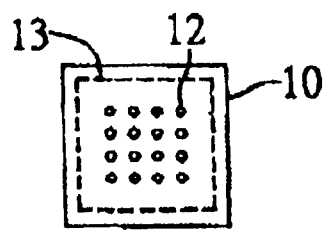
FIG. 1B is a schematic diagram showing a bottom view of the substrate shown in FIG. 1A.

Referring first to FIG. 1A and FIG. 1B, the BGA fabrication method according to the invention is applied on a die-mounted substrate 10, such as a FCBGA (Flip Chip Ball-Grid Array) substrate, which has a front side 10a and a back side 10b, wherein the front side 10a is mounted with at least one semiconductor chip 11 in flip chip (upside down) manner by means of solder bumps 11a, and the back side 10b is provided with a plurality of ball pads 12. In addition, as shown in FIG. 1B, singulation line 13 is predefined on the substrate 10 (illustrated as a dotted line) based on the predefined package size (i.e., the size of the encapsulation body 40 shown in FIG. 7). In this preferred embodiment, assume the predefined package size is 31*31 (mm), then the size of the substrate 10 is predefined to be 32*32 (mm).

Figure 2A:
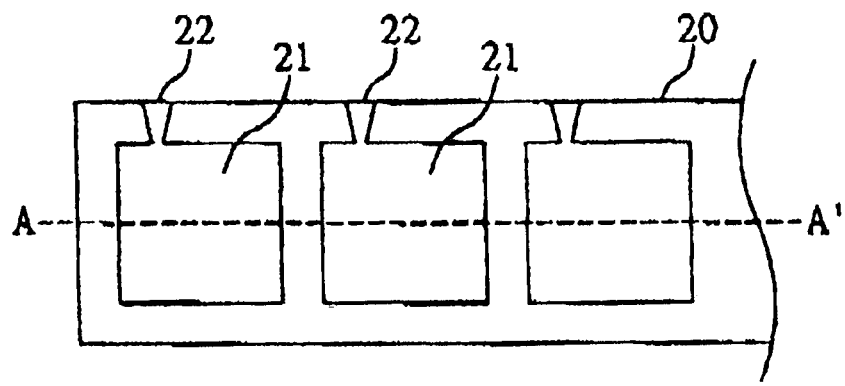
FIG. 2A is a schematic diagram showing a top view of a substrate utilized by the BGA fabrication method according to the invention.
Figure 2B:
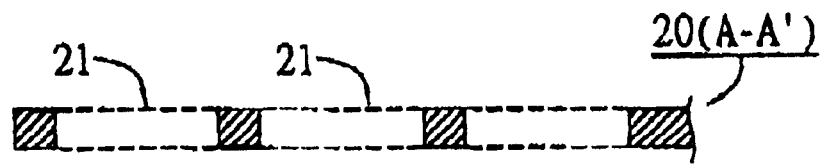
FIG. 2B is a schematic diagram showing a sectional view of the substrate shown in FIG. 2A cutting through the line A-A'.

Referring next to FIG. 2A and FIG. 2B, the BGA fabrication method according to the invention is characterized by the utilization of a specially-designed substrate carrier 20 as an auxiliary tool for the assembly of the substrate 10 and the chip 11. As shown, the carrier 20 is an elongated thin plate made of a fire-retardant and insulative material, such as FR4 (Fire Retardant 4), FR5, BT, and so on, and having a CTE (Coefficient of Thermal Expansion) substantially equal to that of the substrate 10 (or the difference thereof would not cause apparent thermal wrappage under high-temperature conditions). In structure, the carrier 20 is formed with a series of cavities 21, with each of the cavities 21 being in communication with an injection gate 22 and dimensioned to be able to accommodate the substrate 10. In this preferred embodiment, since the substrate 10 is 32*32 (mm) in size, the cavities 21 are each also dimensioned to 32*32 (mm).

Figure 3:
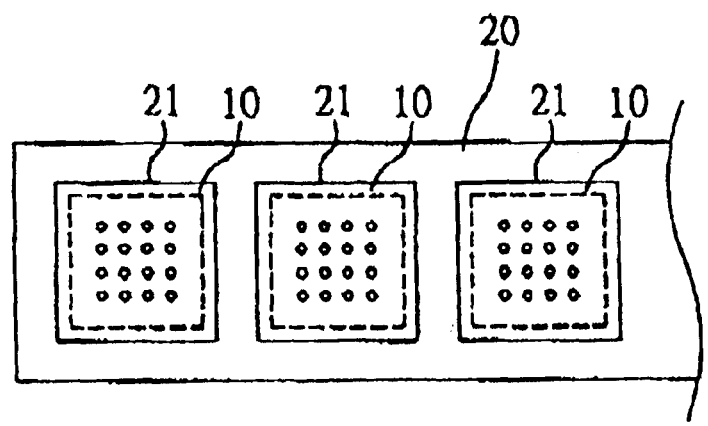
FIG. 3 is a schematic diagram showing a bottom view of the mounting of the substrate shown in FIGS. 1A–1B into the carrier shown in FIGS. 2A–2B.

Referring next to FIG. 3, during the course of the BGA fabrication process, the first step is to embed one substrate 10 into each of the cavities 21 in the carrier 20. Since the carrier 20 is formed with a plurality of cavities 21, a corresponding number of substrate 10 can be embedded into the carrier 20 for batch fabrication of a number of packages on each single carrier 20.

Figure 4:
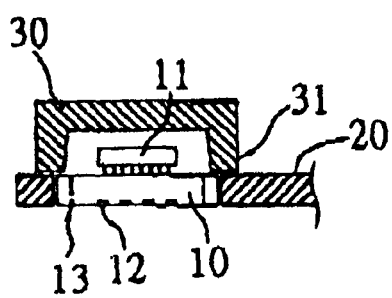
FIG. 4 is a schematic diagram showing a sectional view of the molding process in the BGA fabrication method according to the invention.
Figure 5:
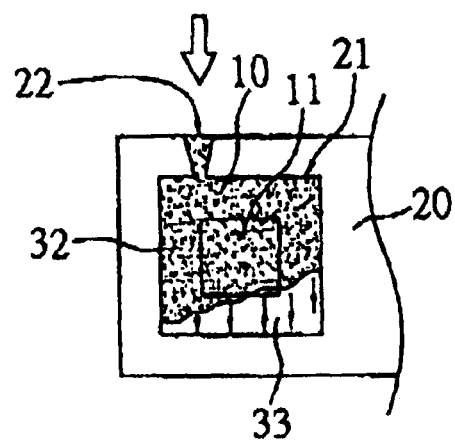
FIG. 5 is a schematic diagram showing a top view of the encapsulation process in the BGA fabrication method according to the invention.

Referring next to FIG. 4, in the subsequent step, a molding or encapsulation process is performed, wherein a conventional two-piece type of mold 30 is affixed to each of the substrate 10 on the carrier 20 and firmly abut the leg portion 31 on the edge of each substrate 10 (i.e., the seam between each substrate 10 and the carrier 20 in each cavity 21) for the purpose of preventing mold leakage from this seam during the molding process. It is to be noted that the inner wall of the mold 30 should be positioned beyond the singulation line 13 on the substrate 10 but within the edge of the cavity 21. As further shown in FIG. 5, in the next step, an encapsulation material 32 is injected via the injection gate 22 into the hollowed space inside the mold 30 to thereby form an encapsulation body 40. During this molding process, since the substrate 10 and the mold 30 are both provided with no air outlets, the air 33 in the hollowed space of the mold 30 will be pushed to one side and thereby form voids 41 in the encapsulation body 40 (as illustrated in FIG. 6).

Figure 6:
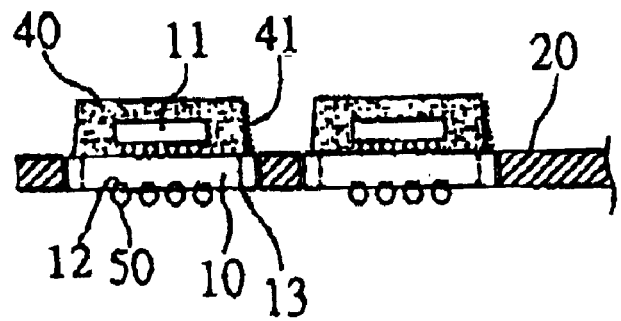
FIG. 6 is a schematic diagram showing a sectional view of the ball-implantation process in the BGA fabrication method according to the invention.

Referring next to FIG. 6, as the encapsulation process is completed, the mold 30 is removed; and next, a ball-implantation process is performed to implant an array of solder balls on the ball pads 12 on the back side 10b of the substrate 10 to thereby form a ball grid array 50.

After the mold 30 is removed, there would exist voids 41 in the encapsulation body 40, which would be considered as a flawed part. However, since these voids 41 exist only beyond the singulation line 13, they can be removed during the subsequent singulation process.

Figure 7:
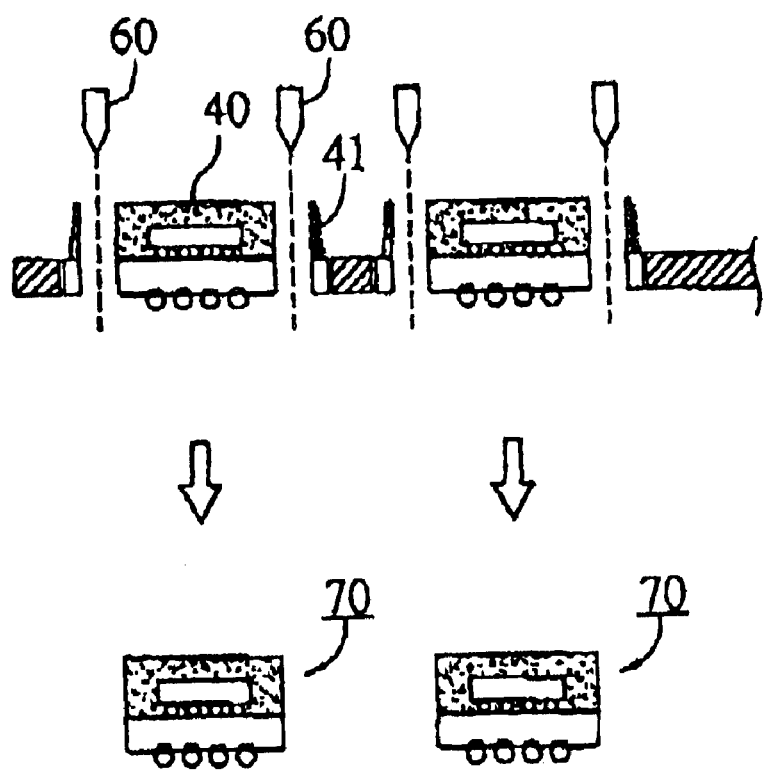
FIG. 7 is a schematic diagram showing a sectional view of the singulation process in the BGA fabrication method according to the invention.

Referring finally to FIG. 7, in the subsequent step, a singulation process is performed, wherein a sawing tool 60 is used to cut the carrier 20 along the singulation line 13 for each substrate 10 to thereby singulate each individual package unit 70. During this singulation process, the voids 41 in the original encapsulation body 40 will be cut away, and as a result, the encapsulation body 40 on the final product would have no voids and therefore is assured in quality.

In conclusion, the invention provides a BGA fabrication method, which is characterized by the utilization of a specially-designed carrier to serve as an auxiliary tool to package semiconductor chips on substrates. Compared to prior art, since the invention provides an injection gate in the carrier, it would not restrict the circuit layout and routability on the substrate. Moreover, it allows the use of a two-piece type of mold for batch molding of a number of encapsulation bodies at the same time, allowing the fabrication to be more productive and cost-effective. Still moreover, the invention an be implemented without having to provide an air outlet in the substrate but nevertheless allow the resulted encapsulation body to be free of voids to help assure the quality of the finished packages. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating BGA (Ball Grid Array) packages, comprising the steps of:

preparing a batch of BGA substrates, each of the substrates having a front side and a back side, with a singulation line being predefined and at least one semiconductor chip being mounted on the front side of each of the substrates;

preparing a carrier, which is formed with a series of cavities in communication with an injection gate;

embedding the substrates respectively into the cavities of the carrier;

performing an encapsulation process to form an encapsulation body to encapsulate each of the substrates and the corresponding one of the chips that is mounted on the substrate;

performing a ball-implantation process to form a ball grid array over the back side of each of the substrates; and performing a singulation process to cut through the singulation lines on the substrates and thereby obtain a plurality of the BGA packages.

2. The method of claim 1, wherein the carrier is substantially equal in CTE (coefficient of thermal expansion) to the substrate.

3. The method of claim 1, wherein the carrier is made of a material selected from the group consisting of epoxy resin, polyimide resin, BT (bismaleimide triazine) resin, FR4 resin, and FR5 resin.

4. The method of claim 1, wherein the chip is mounted in a flip-chip manner on each of the substrates.

5. The method of claim 4, wherein the chip is bonded to the substrate by means of a plurality of solder bumps.

6. The method of claim 1, wherein the encapsulation body is bordered beyond the singulation line on each of the substrates and within the edge of the corresponding one of the cavities of the carrier.

7. The method of claim 6, wherein the singulation process is performed to cut through the encapsulation bodies and the substrates to form the plurality of BGA packages.

8. The method of claim 1, wherein the substrate is a Build-Up (BU) substrate.

9. A method of fabricating BGA packages, comprising the steps of:

preparing a batch of BGA substrates, each of the substrates having a front side and a back side, with a singulation line being predefined and at least one semiconductor chip being mounted in a flip-chip manner on the front side of each of the substrates;

preparing a carrier, which is formed with a series of cavities in communication with an injection gate;

embedding the substrates respectively into the cavities of the carrier;

performing an encapsulation process to form an encapsulation body to encapsulate each of the substrates and the corresponding one of the chips that is mounted on the substrate, wherein the encapsulation body is bordered beyond the singulation line on each of the substrates and within the edge of the corresponding one of the cavities;

performing a ball-implantation process to form a ball grid array over the back side of each of the substrates; and performing a singulation process to cut through the singulation lines on the substrates and thereby obtain a plurality of the BGA packages.

10. The method of claim 9, wherein the carrier is substantially equal in CTE to each of the substrates.

11. The method of claim 9, wherein the carrier is made of the carrier is made of a material selected from the group consisting of epoxy resin, polyimide resin, BT (bismaleimide triazine) resin, FR4 resin, and FR5 resin.

12. The method of claim 9, wherein the substrate is a Build-Up (BU) substrate.

13. The method of claim 9, wherein the singulation process is performed to cut through the encapsulation bodies and the substrates to form the plurality of BGA packages.

* * * * *

UNITED STATES PATENT AND TRADEMARK OFFICE
CERTIFICATE OF CORRECTION

PATENT NO.       : 6,830,957 B2                                       Page 1 of 1
APPLICATION NO. : 10/452488
DATED            : December 14, 2004
INVENTOR(S)      : Pu et al.

It is certified that error appears in the above-identified patent and that said Letters Patent is hereby corrected as shown below:

Title page, section (54), please delete "METHOD OF FABRICATING BGA PACKAGES" and insert therefor --FABRICATION METHOD FOR BALL GRID ARRAY SEMICONDUCTOR PACKAGE--

Signed and Sealed this

Ninth Day of January, 2007

JON W. DUDAS
*Director of the United States Patent and Trademark Office*